United States Patent [19]

Kosmahl

[11] Patent Number: 4,459,562

[45] Date of Patent: Jul. 10, 1984

[54] DIELECTRIC BASED SUBMILLIMETER BACKWARD WAVE OSCILLATOR CIRCUIT

[75] Inventor: Henry G. Kosmahl, Olmsted Falls, Ohio

[73] Assignee: The United States of America as represented by the Administrator of the National Aeronautics and Space Administration, Washington, D.C.

[21] Appl. No.: 434,084

[22] Filed: Oct. 13, 1982

[51] Int. Cl.[3] .......................... H01J 25/40; H03B 9/08

[52] U.S. Cl. ....................................... 331/82; 315/3.6; 315/39.3; 333/162

[58] Field of Search ................. 331/79, 81, 82; 315/3, 315/3.5, 3.6, 4, 39.3; 333/162

[56] References Cited

U.S. PATENT DOCUMENTS 3,610,999 10/1971 Falce et al. .................... 315/39.3 X 4,422,012 12/1983 Kosmahl ........................ 315/39.3 X

*Primary Examiner*—Stanley D. Miller

*Assistant Examiner*—Robert J. Pascal

*Attorney, Agent, or Firm*—Norman T. Musial; John R. Manning; James A. Mackin

[57] ABSTRACT

A ladder circuit especially useful in backward wave oscillators operating in the 500 GHz to 2,000 GHz range comprises a waveguide (10) having disposed therein transversely oriented slabs (16) which contact an upper wall (22) of waveguide (10). The edges of slabs (11) adjacent the physical center of waveguide (10) along which is directed an electron beam (19) have respective curved segments (11) and stubs (12) and (13) of electrically conductive, non-magnetic material supported thereon. The ends of slabs (16) include metal layers (17) and (18) at respective opposite ends to provide a conductive leakage path. A ridge bar (20) is attached to the inside of the bottom wall (21) of the waveguide (10) and includes a concave upper surface which partially straddles electron beam (19). The inside width of the waveguide (10) is approximately one-half wavelength as determined by the frequency of operation of the backward wave oscillator.

12 Claims, 2 Drawing Figures

DIELECTRIC BASED SUBMILLIMETER BACKWARD WAVE OSCILLATOR CIRCUIT

DESCRIPTION

1. Origin of the Invention

This invention was made by an employee of the U.S. Government and may be manufactured or used by for the Government without the payment of any royalties thereon or therefor.

2. Technical Field

This invention relates to submillimeter wave backward wave oscillators and is directed more particularly to a ladder circuit for such an oscillator.

In recent years, many communication satellites have been placed in geosynchronous orbit above the earth. Evaluations of satellite communications within the last few years indicate that in the coming decades there will be such an increasing demand for satellite-to-earth communications that the capacity limits of the frequency bands of presently-used satellites will be exceeded.

In order to transmit increasing amounts of information, it will be necessary to go to higher radiofrequency (RF) transmission bands. Oscillator and transmission tubes operable in the 30/20 GHz range are presently under development. However, it is expected that in the future, frequencies will eventually reach the 100 GHz to 500 GHz range. Additionally, there is presently a demand of backward wave oscillators in the 500 GHz to 2,000 GHz range for applications in molecular spectroscopy, in deep space and plasma research.

As is well-known, as the frequencies at which oscillators and amplifiers operate is increased, numerous problems are encountered. One of these problems involves positioning and assembling the mechanical parts of such devices since these parts are extremely small. For example, for the frequency range from 500 to 2,000 GHz, the rings of a slow wave structure for a backward wave oscillator may be on the order from 0.001 to 0.002 inches in diameter. The spacing of the latter crossbars in such an oscillator may be on the order of 20 to 50 microns.

BACKGROUND ART

U.S. Pat. No. 3,949,263 to Harper discloses that a slow wave structure for a traveling wave device may be supported by diamond heat sink members. The diamond members are bonded to adjacent components by heating an intermediate metal alloy of an inactive conductive metal with a small amount of carbide constituent in a vacuum, under pressure, at a temperature sufficient to melt the alloy.

U.S. Pat. No. 4,278,914 to Harper discloses a slow wave structure such as a helix delay line having diamond heat sink supports. The diamond supports are maintained in good thermal contact with the helix by pressure only in lieu of being bonded to metallic members.

U.S. Pat. No. 3,068,432 to Dohler et al discloses a delay line constructed in the form of a ladder for use in electron discharge tubes operating by interaction between the energies contained respectively in the electron beam and in the field of an ultra high frequency wave propagated along a delay line, as for example, in traveling wave tubes. The invention in the Dohler et al patent is the arrangement by which alternate rungs of the ladder are connected to the top of a wave guide in which the ladder is disposed, the other rungs all being connected to the bottom of the wave guide.

U.S. Pat. No. 2,945,979 to Karp discloses a traveling wave tube structure employing regularly spaced discontinuities of basically simple construction positioned in one wall of a conductively bonded wave guiding path. In one embodiment the discontinuities are formed by slot-like openings through one wall of a rectangular wave guide. In a second embodiment, they are formed by parallel wires laid transversely across an opening in one wall of a rectangular wave guide.

DISCLOSURE OF THE INVENTION

In accordance with the present invention, there is provided a ladder type circuit for a submillimeter wave backward wave oscillator. The slow wave structure includes a length of rectangular waveguide having a relatively thick block of non-magnetic, electrically conducting material attached to, and extending lengthwise along one of the wider walls of the rectangular waveguide. A block of metal, or ridge, is concave along its one surface which is adjacent to a beam of electrons directed along the center of the waveguide.

The ladder circuit is completed by thin slabs of electrically nonconducting material with high thermal conductivity, the slabs being disposed transversely in the waveguide in heat conducting relationship and in contact with the inner surface of the waveguide wall opposite that to which the ridge is attached. The edges of the slabs adjacent the electron beam each includes a depression or quasi-half circle which straddles the electron beam in a grazing relationship. Each of these surfaces is coated with a thin layer of electrically conducting, non-magnetic material. These thin layers on the slabs comprise the electrical structure which interacts with the electron beam to produce an electromagnetic wave in the submillimeter range.

BRIEF DESCRIPTION OF THE DRAWINGS

The details of the invention will be described in connection with the accompanying drawings in which.

BEST MODE FOR CARRYING OUT THE INVENTION

Figure 1:
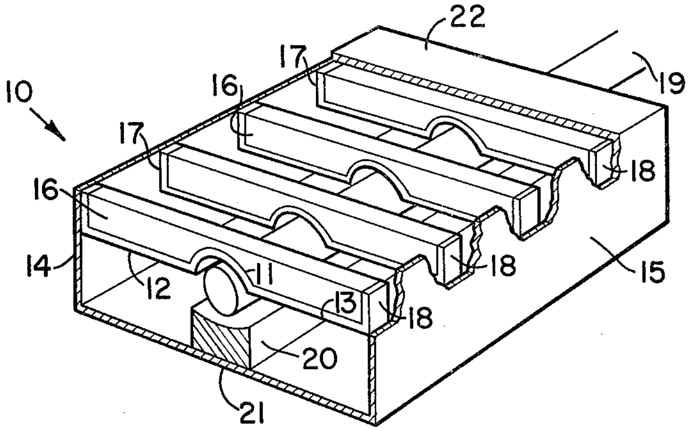
FIG. 1 is a pictorial view of a portion of a ladder circuit and a longitudinal ridge bar disposed in a rectangular waveguide with two of the walls partially cut away.

Referring now to FIG. 1, there is shown a length of rectangular waveguide 10 with the top and one side partially cutaway to show a ladder type circuit comprised of a plurality of curved segments or quasi-half rings 11 of an electrically conductive, non-magnetic material such as copper. The curved segments 11 are aligned to partially straddle an electron beam 19 which is directed along the physical center of waveguide 10. Each of the curved segments 11 has a first stub 12 and a second stub 13 extending to a first wall 14 and a second wall 15, respectively, of waveguide 10. The curved segments 11, together with the stubs 12 and 13, are preferably a copper layer about one-half to five microns, but preferably one micron in thickness supported on thin diamond slabs 16 which are disposed transversely in the rectangular waveguide 10. The critical criterion for the copper layer is that it be greater than the skin-effect thickness for the particular frequency of operation. Material such as BeO, silica, or various ceramic materials as, for example, aluminim oxide can also be used for the slabs 16. The thickness of slabs 16 is on the order of one-half period of the ladder circuit wave.

The ends of the slabs 16 are provided with respective layers 17 and 18 which are extensions of the stubs 12 and 13, respectively. These extensions 17 and 18 are of the same material as stubs 12 and 13 and segments 11, that is an electrically conductive, non-magnetic material with high thermal conductivity, preferably copper. The extensions 17 and 18 contact the respective first and second waveguide walls 14 and 15 and provide electrical leakage paths for stubs 12 and 13. The height of the slabs 16 determines the vertical location of curved segments 11 and stubs 12 and 13 and is chosen such that the electron beam 19 just grazes or comes very close to the curved segments 11. The electron beam provides energy to build up the oscillating electromagnetic wave traversing the ladder circuit.

In order to remove heat from curved segments 11, stubs 12 and 13 and other components of the ladder circuit, there is provided a longitudinally extending ridge bar 20. The ridge bar 20 is attached, as viewed in FIG. 1 to the bottom or third wall 21 of waveguide 10 centered between the first and second walls. The ridge bar 20 is preferably equal in width to the straight line distance between the ends of curved segments 11.

Although the ridge bar 20 is preferably copper, other electrically conducting, non-magnetic materials with high thermal conductivity may be used. In order to avoid excessive heating of the ridge bar 20, its upper surface is concave along its length to avoid any collision or interference with the electron beam 19.

Figure 2:
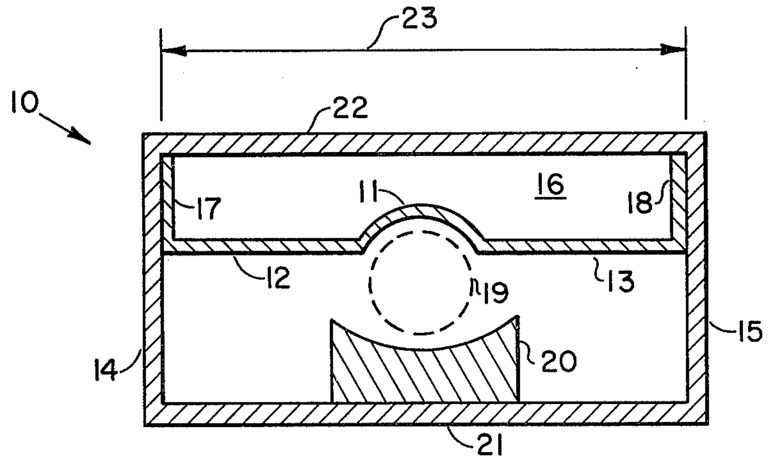
FIG. 2 is a transverse cross-section of the ladder circuit shown in FIG. 1.

FIG. 2 is a transverse cross-section of the ladder circuit shown in FIG. 1 taken on a plane lying in one of the slabs 16. Like parts in FIGS. 1 and 2 are identified by like numerals.

As shown in FIG. 2, the inside width of waveguide 10 is indicated by the double ended arrow 23. This width is approximately one-half wavelength where the frequency of operation is in the range of from 500 GHz to 2,000 GHz. As discussed previously, the dimensions of the various components of a ladder circuit for a submillimeter backward wave oscillator are extremely small. The spacing between the slabs 16 of FIG. 1, for example, may be less than 50 microns while the concave surface of the ridge bar 20 in the curvature of segments 11 have dimensions determined by the electron beam 19 which is only 20 to 30 microns in diameter.

While all the dimensions of the ladder circuit of the invention are critically small, a calculation of these dimensions is determined by the frequency of operation. These calculations are well-known in the art of traveling wave tubes and oscillators wherein the spacing of ladder rungs and the length of the ladder rings are set at fractions of a wavelength, as for example, one-half wavelength or one-quarter wavelength.

To construct the ladder circuit of the invention, mechanical techniques could not be used because of the critically small dimensions. To make the slabs 16 each having a curved segment 11, stubs 12,13, and extensions 17 and 18 attached thereto, a thin, flat, elongated body of diamond material was obtained. A rounded groove was formed in the top surface of the diamond body midway between the longitudinal edges. In this particular case, the groove was formed by ion etching, a process in which material is removed from a body by bombardment with a beam of ions.

The next step was accomplished by vapor-depositing a thin layer of copper on the top and sides of the diamond body. The diamond body was then cut or sliced transversely by a laser beam or ion sputtering, thereby forming the slabs 16 with the rungs comprising components 11,12,13,17 and 18 attached thereto.

The slabs are then disposed in a waveguide such that the nongrooved surface will be in contact with a top surface 22 of the waveguide when the ladder circuit assembly is completed.

The extensions 17 and 28 of FIGS. 1 and 2 are in heat conducting contact with respective walls 14 and 15 of waveguide 10. Bonding of extensions 17 and 18 to the walls 14 and 15, respectively, and bonding of the ridge bar 20 to the bottom wall 22 of waveguide 10 may be accomplished by prior art methods such as that discussed in the Harper patent discussed above under prior art.

It will be understood that changes and modifications may be made to the above described invention without departing from its spirit and scope, as set forth in the claims appended hereto.

I claim:

1. A ladder circuit for a submillimeter wavelength, backward wave oscillator comprising:

a length of rectangular waveguide having top and bottom walls and first and second side walls, a beam of electrons being directed through the waveguide, the beam lying on the longitudinal physical center of the waveguide;

a longitudinally extending ridge bar of electrically conducting, non-magnetic material attached to the bottom wall and having one surface adjacent to the electron beam, said one surface being concave lengthwise along the ridge bar to avoid contact with the electron beam;

a plurality of thin, elongated slabs disposed transversely in said waveguide with one edge contacting the top wall, the opposite edge having therein a depression which partially straddles said electron beam; and disposed in said depression on said opposite edge of each slab, a curved segment connected by first and second stubs to respective first and second side walls of said waveguide, said curved segment and stubs being an electrically conductive non-magnetic material of high thermal conductivity.

2. The ladder circuit of claim 1 wherein each of the ends of said slabs is provided with a layer of electrically conductive, non-magnetic material having high thermal conductivity, said layers being extensions of respective ones of said stubs, said extensions being in contact with respective first and second walls of said waveguide.

3. The ladder circuit of claim 1 wherein said curved segments are quasi half-circles.

4. The ladder circuit of claim 2 wherein said curved segment, said stubs, and said extensions are a vapor deposited layer.

5. The ladder circuit of claim 4 wherein said vapor deposited layer is about 1 micron thick.

6. The ladder circuit of claim 5 wherein said vapor deposited layer is copper.

7. The ladder circuit of claim 1 wherein said slabs are selected from the group of materials consisting of diamond, BeO, silica and aluminum oxide.

8. The ladder circuit of claim 1 wherein said slabs are diamond and said curved segment and stubs are copper.

9. The ladder circuit of claim 1 wherein the width of said waveguide between the inner surfaces of its first and second walls is about one-half wavelength which dimension is no more than 250 microns.

10. The ladder circuit of claim 1 wherein said ridge bar is approximately equal in width to the width of said curved segment.

11. The ladder circuit of claim 1 wherein said curved segment and said stubs are from one-half to five microns thick.

12. The ladder circuit of claim 1 wherein the thickness of said thin, elongated slabs is about one-half period of the backward wave oscillator wave.

* * * * *